United States Patent
Gauweiler et al.

(10) Patent No.: US 7,260,580 B2
(45) Date of Patent: Aug. 21, 2007

(54) BINARY XML

(75) Inventors: Thomas Gauweiler, Speyer (DE); Johannes Viegener, Karlsruhe (DE)

(73) Assignee: SAP AG, Walldorf (DE)

( * ) Notice: Subject to any disclaimer, the term of this patent is extended or adjusted under 35 U.S.C. 154(b) by 465 days.

(21) Appl. No.: 10/867,889

(22) Filed: Jun. 14, 2004

(65) Prior Publication Data

US 2005/0278289 A1    Dec. 15, 2005

(51) Int. Cl.
    *G06F 7/00*    (2006.01)
(52) U.S. Cl. .................. 707/101; 707/100
(58) Field of Classification Search .......... 707/1, 707/513, 100–102
    See application file for complete search history.

(56) References Cited

U.S. PATENT DOCUMENTS

2003/0046317 A1 *    3/2003    Cseri et al. ............... 707/513

OTHER PUBLICATIONS

Bruce Martin, Jun. 24, 1999, WAP Binary XML content Format, [http://www.w3.org/TR/wbxml/#_Toc443384892].*
M. Conners, "*Compact Binary XML*", Sep. 2003, IBM Corporation.

* cited by examiner

*Primary Examiner*—Don Wong
*Assistant Examiner*—Hung Tran Vy
(74) *Attorney, Agent, or Firm*—Finnegan, Henderson, Farabow, Garrett & Dunner, L.L.P.

(57) ABSTRACT

Methods and apparatus, including computer program products, implementing techniques for encoding binary XML. The techniques include receiving data to be encoded and encoding the data as binary XML data. The binary XML data includes one or more elements. Each element is represented by an index number that identifies the element, a length number that indicates the length of the element's name, and token numbers that represent tags delimiting the element. The index numbers, length numbers, and token numbers are encoded as a sequence of bytes including at least one byte that represents a composite number. A composite number is a token number combined with either an index number or length number.

15 Claims, 6 Drawing Sheets

Byte #: Binary Data
0: 00001111 — 360
1: 0⌈01000⌉01
2-9: Binary Representation of "Document"
10: 00000100
11: 00011001
12-17: Binary Representation of "Record" — 340
18: 00010100
19: 00010101
20-24: Binary Representation of "Node1"
25: 00100100
26: 00011110
27-33: Binary Representation of "data1-1"
34: 00010101
35-39: Binary Representation of "Node2"
40: 0011⌈1100⌉
41: 00011110           330
42-48: Binary Representation of "data1-1"
49: 01000111
50: 00010100 — 350
51: 00100100
52: 00011110
53-59: Binary Representation of "data1-1"
60: 00111100
61: 00011110
62-68: Binary Representation of "data1-1"
69: 01100111
70: 00010111
320 —       310

FIG. 3

| Index# | Element |
|---|---|
| 0 | Document |
| 1 | Record |
| 2 | Node1 |
| 3 | Node2 |

FIG. 4

| Token | Tag |
|---|---|
| 0000 | Start Tag with Attributes |
| 0100 | Start Tag without Attributes |
| 1000 | End Tag Followed by Start Tag with Attributes |
| 1100 | End Tag Followed by Start Tag without Attributes |
| 01 | Define Element Name |
| 10 | Define Character Data |
| 0011 | Attribute of an Element |
| 1011 | Last Attribute of an Element |
| 00111 | End Tag |
| 01111 | Start Document |
| 10111 | End Document |

FIG. 5

| Ending Bits | Decoded Result |
|---|---|
| 00 | Token Number is 0000, 0100, 1000, or 1100 |
| 01 | Token Number is 01 |
| 10 | Token Number 10 |
| 11 | Inconclusive: Look at Last Three Bits |
| 011 | Token Number is 0011, or 1011 |
| 111 | Inconclusive: Look at Last Five Bits |
| 00111 | Token Number is 00111 |
| 01111 | Token Number is 01111 |
| 11111 | Reserved for Future Expansion |

FIG. 6 startDocument()
startElement (name = "Document")  ⟵710
startElement (name = "Record")
startElement (name = "Node1")
characters ("data1-1")
endElement (name = "Node1")
startElement (name = "Node2")
characters ("data1-2")
endElement (name = "Node2")
endElement (name = "Record")
startElement (name = "Record")
startElement (name = "Node1")
characters ("data2-1")
endElement (name = "Node1")
startElement (name = "Node2")
characters ("data2-2")
endElement (name = "Node2")
endElement (name = "Record")
endElement (name = "Document")
endDocument()

FIG. 7

BINARY XML

BACKGROUND

The present invention relates to data processing by digital computer, and more particularly to XML (Extensible Markup Language) and other markup languages.

XML is a markup language for marking data with markup tags that indicate what data is being described. For example, the word "phone" placed within markup tags could indicate that the data that followed is a phone number.

XML is commonly represented as textual data. The textual data is generally encoded in a Unicode format, for example, in UTF-8 format.

An alternative approach is to represent XML as binary data. The binary approach is referred to as binary XML.

One binary XML technique is the Compact Binary XML (CBXML) technique proposed by IBM (International Business Machines) of Armonk, N.Y. A description of CBXML has been published at: http://www.w3.org/2003/08/binary-interchange-workshop/presentations-ibm-cbxml.pdf.

SUMMARY OF THE INVENTION

The present invention provides methods and apparatus, including computer program products, implementing techniques for encoding binary XML.

In one aspect, the techniques include receiving data to be encoded and encoding the data as binary XML data. The binary XML data includes one or more elements. Each element is represented by an index number that identifies the element, a length number that indicates the length of the element's name, and token numbers that represent tags delimiting the element. The index numbers, length numbers, and token numbers are encoded as a sequence of bytes including at least one byte that represents a composite number. A composite number is a token number combined with either an index number or length number.

The techniques can be implemented to include one or more of the following features.

The token numbers are encoded as binary numbers of variable length.

Encoding the textual data as binary XML data includes representing two or more tags using a single token number.

Encoding the textual data as binary XML data includes representing an end tag of a first element followed by a start tag of a second element using a single token number.

Encoding the textual data as binary XML data includes representing each element by a length number that corresponds to the number of characters in the element's name.

For each byte, the highest bit is reserved as a continuation bit that indicates whether or not the encoding stored in the byte continues into another byte.

In another aspect, the techniques include receiving textual data encoded as a binary XML data and decoding the binary XML data to reveal the textual data. The binary XML data includes one or more elements. Each element is represented by an index number that identifies the element, a length number that indicates the number of characters in the element's name, and token numbers that represent tags delimiting the element. The index numbers, length numbers, and token numbers are encoded as a sequence of bytes including at least one byte that represents a token number combined with either an index number or length number. Decoding the binary XML data includes decoding the at least one byte into two numbers, a token number and either a length number or index number.

The techniques can be implemented to include one or more of the following features.

The token numbers are encoded as binary numbers of variable length.

Encoding the textual data as binary XML data includes representing two or more tags using a single token number.

Encoding the textual data as binary XML data includes representing an end tag of a first element followed by a start tag of a second element using a single token number.

Encoding the textual data as binary XML data includes representing each element by a length number that corresponds to the number of characters in the element's name.

For each byte, the highest bit is reserved as a continuation bit that indicates whether or not the encoding stored in the byte continues into another byte.

The techniques further include storing the textual data in memory and using the length numbers to determine how much memory to allocate for the element names.

The invention can be implemented to realize one or more of the following advantages.

Encoding and decoding the XML data is performed quickly and efficiently. The encoding and decoding can be performed without having to store the entire XML data in memory.

The size of binary XML data is reduced relative to the size of binary XML data encoded using other binary XML techniques. This reduces the amount of bandwidth required to transmit the binary XML data and the amount of memory space required to store the binary XML data.

The process of allocating memory for the binary XML data is optimized relative to the process of allocating memory for the binary XML data encoded using other binary XML techniques.

Unicode strings are encoded using a format that is simpler and faster than conventional Unicode formats such as UTF-8.

One implementation of the invention provides all of the above advantages.

Details of one or more implementations of the invention are set forth in the accompanying drawings and in the description below. Further features, aspects, and advantages of the invention will become apparent from the description, the drawings, and the claims.

BRIEF DESCRIPTION OF THE DRAWINGS

FIG. 3 illustrates binary XML.

FIG. 4 shows an example of token numbers used in binary XML.

FIG. 5 shows an example of index numbers used in binary XML.

FIG. 6 shows a table used for decoding binary XML.

FIG. 7 shows an example of events produced during decoding of binary XML.

Like reference numbers and designations in the various drawings indicate like elements.

DETAILED DESCRIPTION

Figure 1:
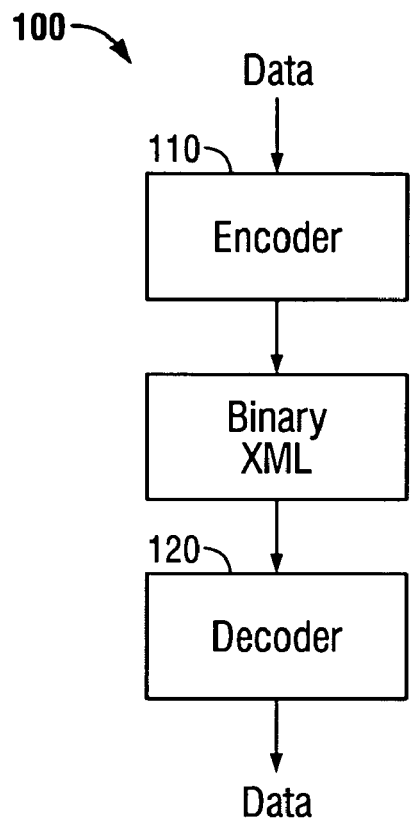
FIG. 1 is a block diagram of a system in accordance with the invention.

As shown in FIG. 1, a system 100 in accordance with the invention includes an encoder 110 for encoding data using a binary XML technique that will be described below. The system 100 also includes a binary XML decoder 120 for decoding data that has been encoded using the binary XML technique.

The binary XML technique is a technique for representing XML as binary data rather than as textual data. In XML, each element is represented by a pair of tags (start tag and end tag) that contain the element's name and that marks the beginning and the end of the element, respectively.

The binary XML technique uses token numbers to represent tags and index numbers to represent element names.

Figure 2:
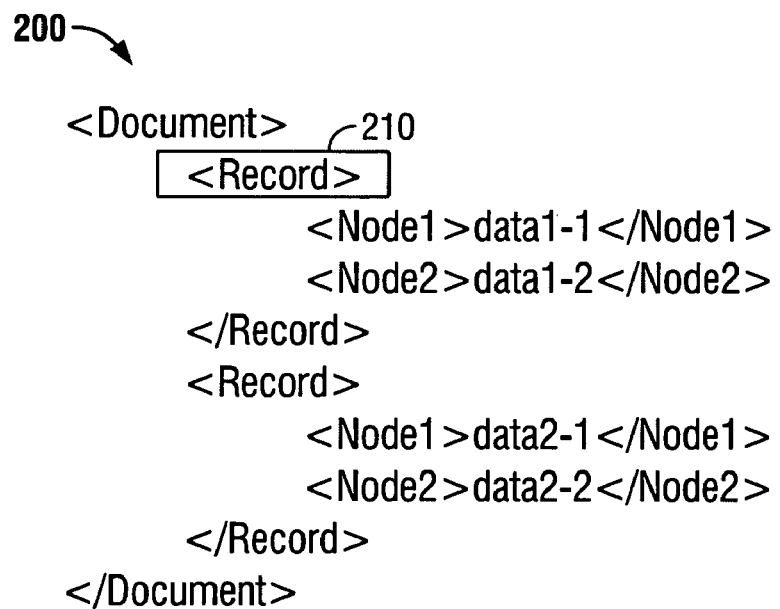
FIG. 2 shows an example of data encoded in XML.

For example, FIG. 2 shows data 200 encoded in XML. FIG. 3 shows this same data 200, but encoded using the binary XML technique. The element names in this example are represented by the index numbers 410 shown in FIG. 4. The tags in this example are represented by the token numbers 510 shown in FIG. 5.

Figure 9:
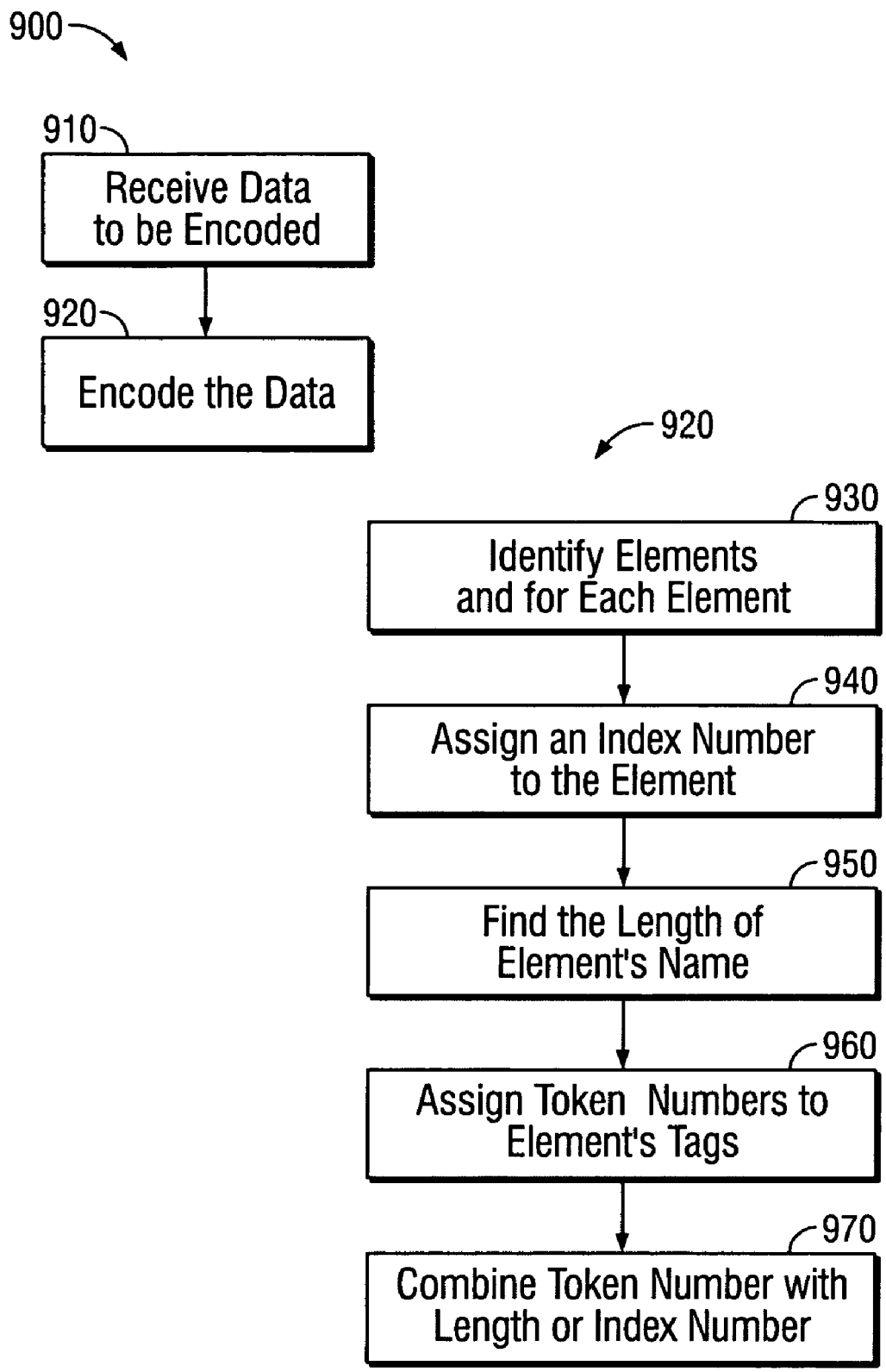
FIG. 9 is a flow diagram of a method in accordance with the invention.

During system operation, as illustrated by method 900 of FIG. 9, the encoder 110 receives data to be encoded (step 910) and encodes the data as binary XML data (step 920).

To encode the data, the encoder performs the following steps:

The encoder 110 identifies in the data one or more elements (step 930).

For each identified element, the encoder 110 assigns an index number to the element's name (step 940), finds the length of the element's name (step 950), assigns token numbers to represent the element's tags (step 960), and combines token numbers with either index numbers or the length numbers to form composite numbers (step 970).

Variable Length Encoding

Each token number is a binary number of variable length. In one implementation, the shorter token numbers are assigned to the more frequently occurring tags or tag combinations. In the example above, the token number 520 represents a single tag whereas the token number 530 represents a tag combination, specifically, the combination of an end tag followed by a start tag.

Simplified Format for Unicode

In one implementation, the encoder 110 only uses the lowest seven bits 310 in a byte for storing the binary XML data. The encoder 110 reserves the highest bit 320, for example, the rightmost bit, for use as a continuation bit. The continuation bit is set to 0 if the binary number is between 0 and 127 inclusive and is set to 1 if the binary number is greater than 128.

In the case where the binary number is greater than 128, more than one byte is needed to represent the number. In such cases, all but the last byte has the continuation bit set to 1. The last byte has the continuation bit set to 0.

Combination of Token Number with Index Number

In one implementation, the encoder 110 combines a token number with an index number and represents both binary numbers as single binary number referred to as a composite number 330. One technique for forming a composite number is bit shifting. With bit shifting, all of the bits representing one of the binary numbers is shifted so as to leave a designated number of bits unoccupied. The encoder 110 then uses the bits unoccupied by the first binary number to store the second binary number. In one implementation, the encoder masks out the unoccupied bits and combines the two numbers together using an OR operation.

Avoiding Repetition of Element Names

In one implementation, for the first occurrence 340 of an element, the encoder 110 encodes both the element's name and its index number. For each subsequent occurrence 350 of the element, however, the name is omitted and only the index number is encoded. The name does not need to be repeated for each occurrence of the element.

Length Numbers

In one implementation, when an element's name is included in the binary XML data, a length number 360 is also included. The length number can indicate the number of bytes occupied by the element's name, or alternatively, it can indicate the number of characters in the element's name. As will be described below, the character count can be used during decoding to determine how much memory needs to be allocated to store the element's name. The length number can be combined with a token number to form a composite number in a similar manner as described above for index numbers.

Decoding Process

During the decoding process, the decoder 120 decodes a composite number into two separate numbers, a token number and either an index number or a length number. To do so, the decoder 120 must determine which bits of the composite number represent the token number and which bits of the composite number represent the index or length number.

As described above, the length of the token number can vary. In the example above, the length of the token number varies from two bits to five bits. The decoder 120 can use the table illustrated in FIG. 6 to determine which bits represent the token number.

First, the decoder 120 looks at the last two bits. If the last two bits are 00, then the token number is a four-bit token number ending in 00. If the last two bits are 01 or 10, then the token number is 01 or 10, respectively. If the last two bits are 11, then the decoder 120 looks at the last three bits.

If the last three bits are 011, then the token is a four-bit token number ending in 011. If the last three bits are 111, then the decoder 120 looks at the last five bits.

If the last five bits are 00111, 01111, or 10111, then the token number is 00111, 01111, or 10111, respectively. The token number 11111 is reserved for expansion.

In one implementation, the decoder 120 uses a SAX (Simple API for XML) parser to parse the binary XML data. The SAX parser generates an event for each tag or character data item that it encounters during parsing of the binary XML data. FIG. 7 shows events produced during parsing of the binary XML data in the example above. For example, event 710 is produced during parsing of data 210 (FIG. 2)

Scenarios

The system 100 can generate binary XML data by converting existing XML data into binary XML data. Alternatively, the system 100 can generate binary XML data directly without first generating XML data.

Figure 8:
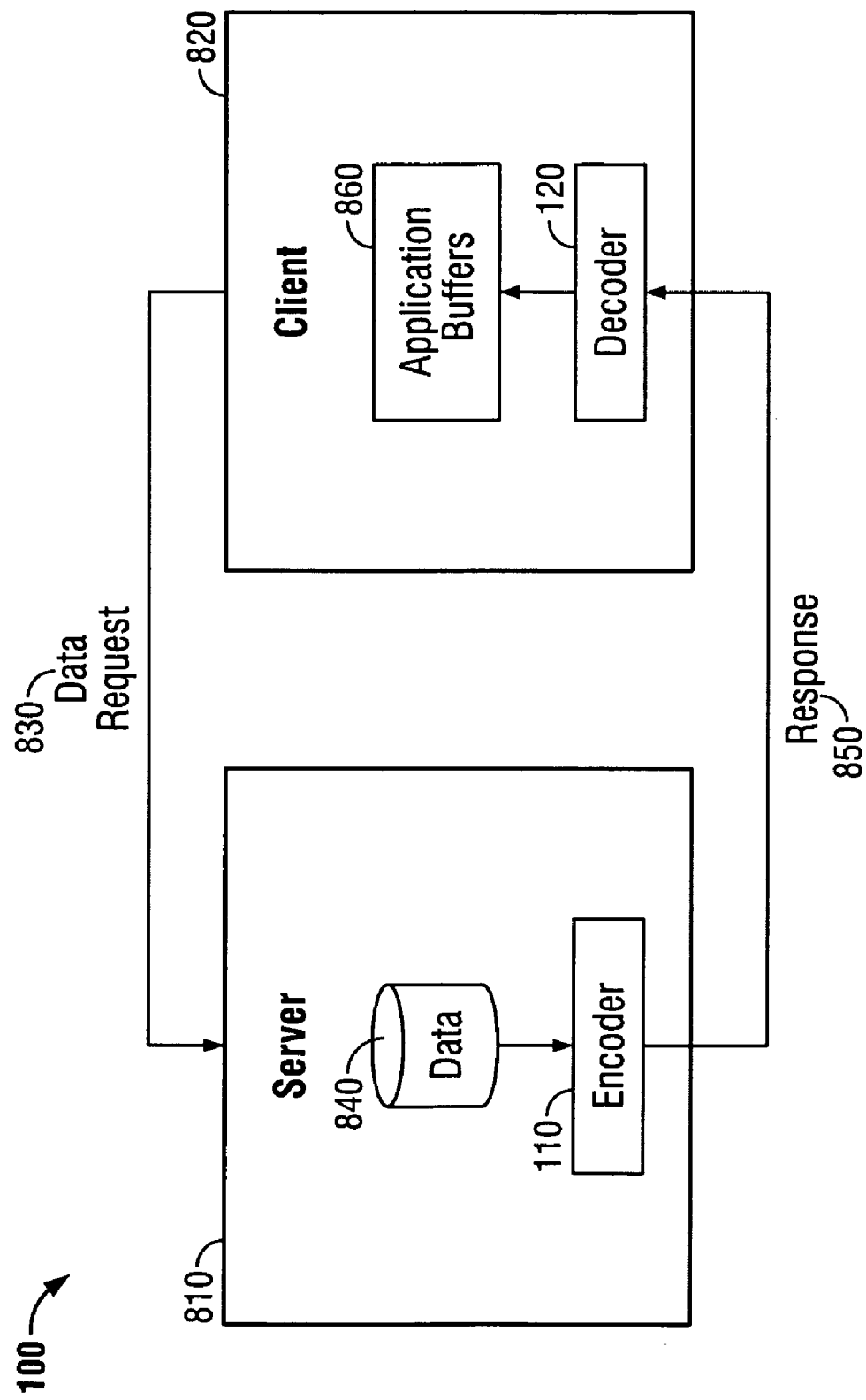
FIG. 8 is a schematic diagram of a scenario involving binary XML.

As shown in FIG. 8, in one example scenario involving the system 100, a server 810 receives from a client application 820 a request 830 for data 840 maintained by the server 810. In response to this request, the server 810 retrieves the data 840, and sends a response 850 that contains the retrieved data 840. In one implementation, either or both of the request 830 and the response 850 can be encoded as binary XML data. The server 810 typically does not store the binary XML data of the request or the response; however, in some cases, it may be desirable to cache the binary XML data of the request or the response.

On the receiving end, the client application 820 receives the response 850, reads and decodes all of the data 840 and writes the entire data 840 into one or more application buffers 860. In writing the data 840 to the buffers 860, the client 820 can use the length numbers associated with the element names to determine how much buffer space to allocate for the element names.

The above-described scenario illustrates how the above-described binary XML techniques can be used for communication purposes, and in particular for communication between clients and servers. The techniques, however, are not limited to this purposes and can be used for other purposes, for example, for data storage purposes.

The invention and all of the functional operations described in this specification can be implemented in digital electronic circuitry, or in computer software, firmware, or hardware, including the structural means disclosed in this specification and structural equivalents thereof, or in combinations of them. The invention can be implemented as one or more computer program products, i.e., one or more computer programs tangibly embodied in an information carrier, e.g., in a machine-readable storage device or in a propagated signal, for execution by, or to control the operation of, data processing apparatus, e.g., a programmable processor, a computer, or multiple computers. A computer program (also known as a program, software, software application, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file. A program can be stored in a portion of a file that holds other programs or data, in a single file dedicated to the program in question, or in multiple coordinated files (e.g., files that store one or more modules, sub-programs, or portions of code). A computer program can be deployed to be executed on one computer or on multiple computers at one site or distributed across multiple sites and interconnected by a communication network.

The processes and logic flows described herein, including the method steps of the invention, can be performed by one or more programmable processors executing one or more computer programs to perform functions of the invention by operating on input data and generating output. The processes and logic flows can also be performed by, and apparatus of the invention can be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for executing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. Information carriers suitable for embodying computer program instructions and data include all forms of non-volatile memory, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in special purpose logic circuitry.

The invention can be implemented in a computing system that includes a back-end component (e.g., a data server), a middleware component (e.g., an application server), or a front-end component (e.g., a client computer having a graphical user interface or a Web browser through which a user can interact with an implementation of the invention), or any combination of such back-end, middleware, and front-end components. The components of the system can be interconnected by any form or medium of digital data communication, e.g., a communication network. Examples of communication networks include a local area network ("LAN") and a wide area network ("WAN"), e.g., the Internet.

The computing system can include clients and servers. A client and server are generally remote from each other and typically interact through a communication network. The relationship of client and server arises by virtue of computer programs running on the respective computers and having a client-server relationship to each other.

The invention has been described in terms of particular embodiments, but other embodiments can be implemented and are within the scope of the following claims. For example, although the binary encoding technique has been described in terms of its applicability to XML text, it can be used with any markup language text that is well-formed (e.g., the end tags match the start tags). As another example, the operations of the invention can be performed in a different order and still achieve desirable results. In certain implementations, multitasking and parallel processing may be preferable. Other embodiments are within the scope of the following claims

What is claimed is:

1. A computer program product tangibly embodied in a computer-readable storage medium, the computer program product comprising instructions operable to cause a data processing apparatus to perform operations comprising:

receiving data to be encoded;

encoding the data as binary XML data, the binary XML data including one or more elements, wherein each element is represented by an index number that identifies the element, a length number that indicates the length of the element's name, and token numbers that represent tags delimiting the element, and wherein the index numbers, length numbers, and token numbers are encoded as a sequence of bytes including at least one byte that represents a composite number, a composite number being a token number combined with either an index number or length number; and transmitting the binary XML data.

2. The product of claim 1, wherein the token numbers are encoded as binary numbers of variable length.

3. The product of claim 1, wherein encoding the textual data as binary XML data includes representing two or more tags using a single token number.

4. The product of claim 1, wherein encoding the textual data as binary XML data includes representing an end tag of a first element followed by a start tag of a second element using a single token number.

5. The product of claim 1, wherein encoding the textual data as binary XML data includes representing each element by a length number that corresponds to the number of characters in the element's name.

6. The product of claim 1, wherein for each byte, the highest bit is reserved as a continuation bit that indicates whether or not the encoding stored in the byte continues into another byte.

7. A computer program product tangibly embodied in a computer-readable storage medium, the computer program product comprising instructions operable to cause a data processing apparatus to perform operations comprising:

receiving textual data encoded as a binary XML data, the binary XML data including one or more elements, wherein each element is represented by an index number that identifies the element, a length number that indicates the number of characters in the element's name, and token numbers that represent tags delimiting the element, and wherein the index numbers, length numbers, and token numbers are encoded as a sequence of bytes including at least one byte that represents a token number combined with either an index number or length number;

decoding the binary XML data to reveal the textual data, including decoding the at least one byte into two numbers, a token number and either a length number or index number; and using the length numbers to determine the amount of buffer space to allocate for the element names.

8. The product of claim 7, wherein the token numbers are encoded as binary numbers of variable length.

9. The product of claim 7, wherein encoding the textual data as binary XML data includes representing two or more tags using a single token number.

10. The product of claim 7, wherein encoding the textual data as binary XML data includes representing an end tag of a first element followed by a start tag of a second element using a single token number.

11. The product of claim 7, wherein encoding the textual data as binary XML data includes representing each element by a length number that corresponds to the number of characters in the element's name.

12. The product of claim 7, wherein for each byte, the highest bit is reserved as a continuation bit that indicates whether or not the encoding stored in the byte continues into another byte.

13. The product of claim 7, further comprising:

storing the textual data in memory and using the length numbers to determine how much memory to allocate for the element names.

14. An apparatus comprising:

means for receiving data to be encoded;

means for encoding the data as binary XML data, the binary XML data including one or more elements, wherein each element is represented by an index number that identifies the element, a length number that indicates the length of the element's name, and token numbers that represent tags delimiting the element, and wherein the index numbers, length numbers, and token numbers are encoded as a sequence of bytes including at least one byte that represents a composite number, a composite number being a token number combined with either an index number or length number; and means for transmitting the binary XML data.

15. An apparatus comprising:

means for receiving textual data encoded as a binary XML data, the binary XML data including one or more elements, wherein each element is represented by an index number that identifies the element, a length number that indicates the number of characters in the element's name, and token numbers that represent tags delimiting the element, and wherein the index numbers, length numbers, and token numbers are encoded as a sequence of bytes including at least one byte that represents a token number combined with either an index number or length number;

means for decoding the binary XML data to reveal the textual data, including decoding the at least one byte into two numbers, a token number and either a length number or index number; and means for using the length numbers to determine the amount of buffer space to allocate for the element names.

* * * * *